United States Patent
Ma (10) Patent No.: US 7,872,924 B2
(45) Date of Patent: *Jan. 18, 2011

(54) MULTI-PHASE DUTY-CYCLE CORRECTED CLOCK SIGNAL GENERATOR AND MEMORY HAVING SAME

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

This patent is subject to a terminal disclaimer.

(21) Appl. No.: 12/259,938

(22) Filed: Oct. 28, 2008

(65) Prior Publication Data

US 2010/0103746 A1    Apr. 29, 2010

(51) Int. Cl.
*G11C 16/04* (2006.01)
(52) U.S. Cl. .................... 365/189.05; 365/233.11; 365/194; 365/230.06
(58) Field of Classification Search ............ 365/189.05, 365/233.11, 194, 230.06, 233.1; 327/149, 327/158, 156
See application file for complete search history.

(56) References Cited

U.S. PATENT DOCUMENTS

| | | | |
|---|---|---|---|
| 6,304,116 B1 | 10/2001 | Yoon et al. | 327/158 |
| 7,084,686 B2 | 8/2006 | Zimlich | 327/291 |
| 7,106,655 B2 | 9/2006 | Lee | 365/233 |
| 7,426,145 B2 * | 9/2008 | Lee et al. | 365/189.05 |
| 2008/0252340 A1 | 10/2008 | Yeo et al. | 327/156 |
| 2010/0085094 A1 | 4/2010 | Ma | 327/158 |
| 2010/0085099 A1 | 4/2010 | Ma | 327/295 |

OTHER PUBLICATIONS

Ki-Won Lee et al.; "*A 1.5-V 3.2 Gb/s/pin Graphic DDR4 Sdram With Dual-Clock System, Four-Phase Input Strobing, and Low-Jitter Fully Analog DLL*"; IEEE Journal of Solid-State Circuits, vol. 42; No. 11; Nov. 2007; pp. 2369-2377.

* cited by examiner

*Primary Examiner*—David Lam
(74) *Attorney, Agent, or Firm*—Dorsey & Whitney LLP (57) ABSTRACT

Memories, multi-phase clock signal generators, and methods for generating multi-phase duty cycle corrected clock signals are disclosed. For example, one such clock signal generator includes a delay-locked loop having a first multi-tap adjustable delay line configured to delay a reference signal to provide a plurality of clock signals having different phases relative to the reference clock signal. A periodic signal generated by the delay-locked loop is provided to a second multi-tap adjustable delay line as an input clock signal. Clock signals from taps of the second multi-tap adjustable delay line are provided as the multi-phase duty cycle corrected clock signals.

34 Claims, 7 Drawing Sheets

MULTI-PHASE DUTY-CYCLE CORRECTED CLOCK SIGNAL GENERATOR AND MEMORY HAVING SAME

TECHNICAL FIELD

Embodiments of the invention relate generally to clock signal generators, and more particularly, clock signal generators for generating multi-phase duty-cycle corrected clock signals.

BACKGROUND OF THE INVENTION

Periodic signals are used in a variety of electronic devices. One type of periodic signal are clock signals that can be used to establish the timing of a signal or the timing at which an operation is performed on a signal. For example, data signals are typically coupled to and from memory, such as synchronous dynamic random access memory ("SDRAM"), in synchronism with a clock or data strobe signal. More specifically, read data signals are typically coupled from a memory in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal should have a phase that is the quadrature (having a phase 90-degrees relative to the phase) of the write data signals so that a write data strobe signal transitions during a "data eye" occurring at the center of the period in which the write data signals are valid.

Internal clock signals generated in electronic devices, for example, memory devices or memory controllers, are often synchronized or have some other controlled phase relationships relative to external or internal clock signals. For example, with reference to a memory, a quadrature clock signal used for both latching write data and outputting read data may be generated in the memory to which the data are being written. The quadrature clock signal is typically generated in the memory device from an internal clock signal that is also derived from the system clock signal.

Internal clock signals having synchronized or some other controlled phase relationships with external and internal clock signals may also be used for applications other than for use as a write data strobe signal. For example, a "frequency doubler" circuit, which generates an output clock signal having twice the frequency of an input clock signal, can be implemented using an appropriate logic circuit that receives the input clock signal and quadrature versions of the input signal. Internal signals may also be generated having other than a quadrature phase relationships. Generally, any phase relationship between output clock signals can be used.

Various techniques can be used to generate a quadrature clock signals or read/write data strobe signal. If the frequency of the internal clock signal is fixed, quadrature clock signals may be generated by a timing circuit that simply generates a transition of the quadrature clock signals a fixed time after a corresponding transition of the internal clock signal. However, synchronous memory are typically designed and sold to be operated over a wide range of clock frequencies. Therefore, it is generally not practical to use a fixed timing circuit to generate quadrature clock signals from the internal clock signal. Instead, a circuit that can adapt itself to an internal clock signal having a range of frequencies must be used.

An example of such a circuit is a multi-phase clock signal generator. A multi-phase clock signal generator, as known, generates multi-phase clock signals to provide several clock signals having fixed phase relationships to a reference clock signal, such as an external or internal clock signal. A multi-phase clock signal generator typically includes a multi-tap adjustable delay line that is used to delay and divide phase relationships within the reference clock signal. The multi-tap adjustable delay line is fine-tuned until the phase of a delayed clock signal from the adjustable delay line is in-phase with a reference signal. Generally, multi-phase signals are "tapped" from the adjustable delay line having equal delays relative to one another. The result is provision of several multi-phase clock signals having pre-defined phase relationships with one another. Phases are typically divided evenly within one or a number of reference clock periods. For example, two-phase, triple-phase, quadrature-phase or five-phase are typical choices.

The multi-phase clock signals provided by the multi-phase clock signal generator, however, generally have the same duty-cycle distortion as the reference clock signal. That is, if the reference clock signal exhibits a distorted duty-cycle, by virtue of the reference clock signal being propagated through a series of delay elements of the adjustable delay line, the multi-phase clock signals will have a similar distorted duty-cycle. A clock period is considered as having a duty-cycle distortion when there is deviation from a clock pulse of 50 percent. In some applications, for example in a memory or other types of electronic systems where power supply noise and clock jitter with severe duty-cycle distortion may be present, it is desirable to generate high-speed, duty-cycle corrected multi-phase clock signals over a wide frequency range and that have high accuracy. Additionally, generating multi-phase clock signals in high-speed systems present additional challenges. For example, in such applications it is desirable for multi-phase clock signal generators to generate multi-phase clock signals having highly accurate phase relationships, operate at high-speed and over wide frequency ranges, provide fast robust initialization, have tolerance to wide reference clock duty-cycle distortion, and provide accurate duty-cycle correction capability. It is additionally desirable for the multi-phase clock signal generators to have relatively low power consumption and have limited circuit layout cost.

Therefore, there is a need for multi-phase clock signal generators providing multi-phase clock signals having corrected duty-cycles.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
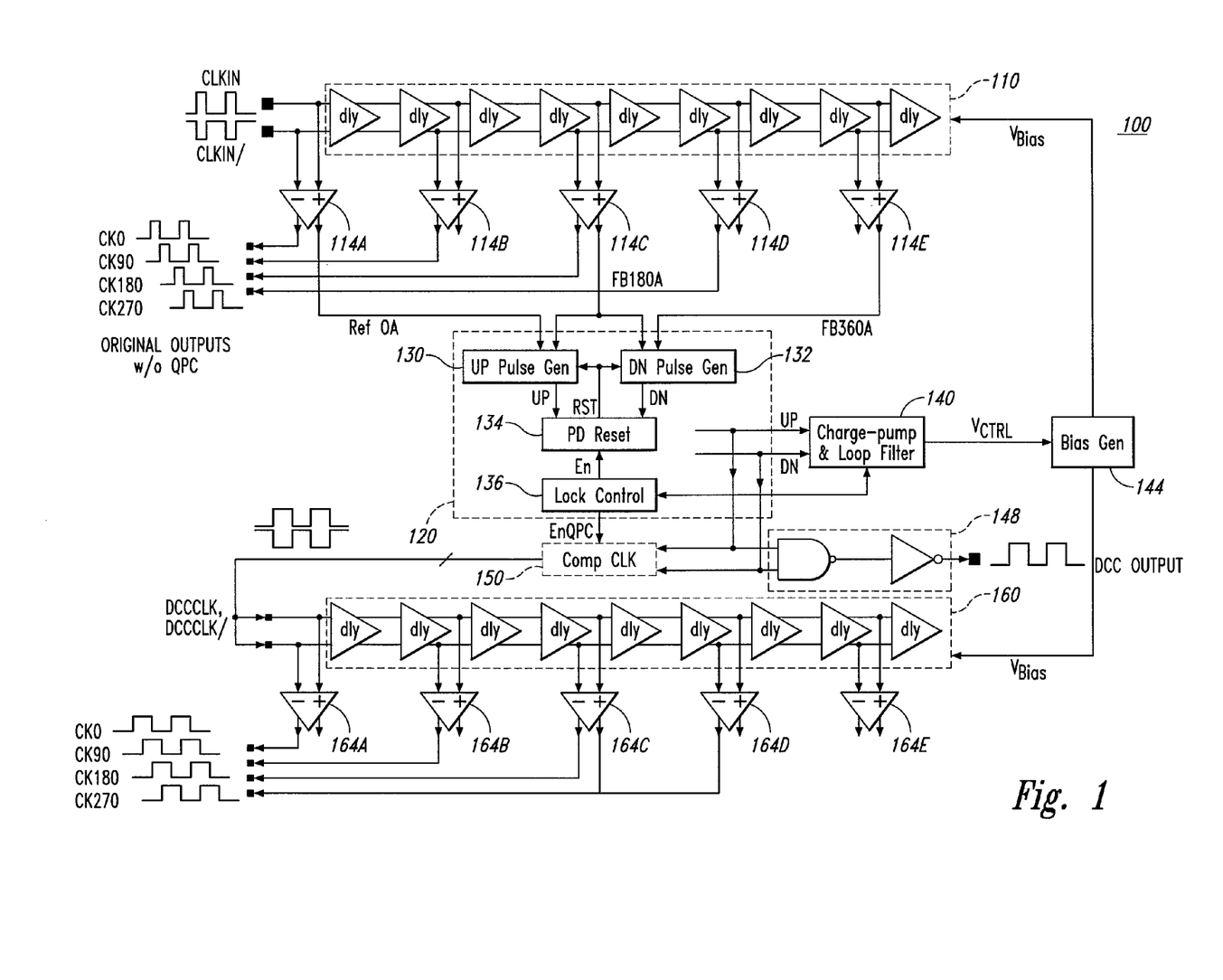
FIG. 1 is a block diagram of a multi-phase duty-cycle corrected clock signal generator according to an embodiment of the invention.

FIG. 1 illustrates a multi-phase duty-cycle corrected clock signal generator 100 according to some embodiments of the invention. The clock signal generator 100 includes a multi-tap adjustable delay line 110, clock buffers 114A-E, a phase detector 120, a charge-pump and loop filter 140, and a bias generator 144 coupled together to provide a multi-phase delay-locked loop configuration. The phase detector 120 is coupled to the clock buffers 114A, 114C, 114E to receive REF0A, FB180A, FB360A clock signals. The phase detector 120 generates control pulse signals UP and DN having pulse widths indicative of the phase differences between the REF0A, FB180A, FB360A clock signals. The UP and DN signals are provided to the charge-pump and loop filter 140 that generates a control voltage VCTRL. The VCTRL voltage is provided to the bias generator 144 which generate a bias voltage VBIAS that is used to adjust the delay time of the adjustable delay line 110. The phase detector 120 continues to modify the pulse widths of the UP and DN signals until the adjustable delay line 110 is adjusted to provide synchronized REF0A and FB360A clock signals (i.e., in phase). Once this occurs, the delay-locked loop is considered to be in a "locked" condition.

In some embodiments, such as that shown in FIG. 1, the phase detector 120 includes a first pulse generator 130 and a second pulse generator 132. The first pulse generator 130 generates the UP signal and the second pulse generator 132 generates the DN signal. As previously described, the UP and DN signals are coupled to the charge-pump and loop filter 140 and are used to adjust the delay of the delay line 110. A reset pulse generator 134 is coupled to the first and second pulse generators 130, 132 to receive the UP and DN signals. The reset pulse generator 134 generates a reset signal RST to reset the first and second pulse generators 130, 132 in response to the UP and DN signals. In summary, the reset pulse generator 134 is used to improve initialization time of the multi-phase delay-locked loop of the multi-phase duty-cycle corrected clock signal generator 100. A more detailed description of multi-phase delay-locked loops having similar phase detectors as that shown in FIG. 1 is provided in U.S. patent application Ser. No. 12/245,407 entitled MULTI-PHASE SIGNAL GENERATOR AND METHOD and filed Oct. 3, 2008, which is incorporated herein by reference in its entirety and for all of its teachings.

In other embodiments, the phase detector employed by the delay-locked loop configuration may be different than that specifically described with reference to FIG. 1.

A delay-lock control circuit 136 provides control signals to the reset pulse generator 134 and the charge-pump and loop filter 140, as well as to a complementary clock signal generator 150. Operation of the multi-phase duty-cycle corrected clock signal generator 100 is controlled in part by the delay-lock control circuit 136, as will be described in more detail below.

When the REF0A and FB360A clock signals are synchronized, the output of the delay-locked loop configuration provides quadrature multi-phase clock signals CK0, CK90, CK180, and CK270. As known, quadrature clock signals have 90-degree phase relationships with one another, in particular, the CK90 clock signal is 90-degrees out of phase with the CK0 clock signal, the CK180 clock signal is 90-degrees out of phase with the CK90 clock signal, and the CK270 clock signal is 90-degrees out of phase with the CK180 clock signal. Although the CK0, CK90, CK180, and CK270 clock signals have the correct quadrature phase relationships, these clock signals are not duty-cycle corrected, and generally have the same duty-cycle distortion as the input clock signals CLKIN, CLKIN/. Nevertheless, the CK0, CK90, CK180, and CK270 clock signals may be appropriate for use with some circuitry or in some situations, for example, where duty-cycle corrected clock signals are not necessary or when the input clock signal has a tolerable distortion compared to the operating frequency period.

As previously discussed, the pulse widths of the UP and DN signals generated by the phase detector 120 are adjusted until the delay-locked loop reaches a locked condition. When a locked condition is reached, the UP and DN signals are in-phase with one another and further synchronized with the CK180 clock signal. Moreover, the UP and DN signals under a locked condition have pulse widths equal to one-half the clock period of the CLKIN, CLKIN/ signals. That is, the UP and DN signals have 50-percent duty-cycles.

The UP and DN signals may be input to output clock logic 148 to provide at least a single-ended, duty-cycle corrected output clock signal DCCOutput, as shown in FIG. 1, or additionally or in the alternative, fully-differential DCCCLK, DCCCLK/ clock signals. In some embodiments, the output clock logic 148 includes a two-input NAND logic gate coupled to receive the UP and DN signals and an inverter coupled to the output of the NAND logic gate. In other embodiments, the output clock logic 148 can be implemented as a shorted two-input NAND gate (functions as an inverter) coupled to the output of the NAND logic gate. The DCCOutput clock signal is synchronized with the CLKIN, CLKIN/ signals except for the propagation delay of the output clock logic 148.

The UP and DN signals are provided to the complementary clock signal generator 150 that generates complementary clock signals DCCCLK, DCCCLK/ in response to the in-phase UP and DN signals. As previously discussed, the UP and DN signals have 50-percent duty-cycles once the delay-locked loop reaches a locked condition and are synchronized with the CK180 clock signal. The complementary clock signal generator 150 further receives control signals from the delay-lock control circuit 136 that enable operation of the complementary clock signal generator 150.

The DCCCLK, DCCCLK/ clock signals are generally duty-cycle corrected and synchronized with the CLKIN, CLKIN/ clock signals, with the propagation delay of the first and second pulse generators 130, 132 and the complementary clock signal generator 150.

The DCCCLK, DCCCLK/ clock are provided to a multi-tap adjustable delay line 160 to generate duty-corrected multiphase clock signals. The resulting multi-phase clock signals are provided to clock buffers 164A-E to provide output clock signals CLK0, CLK90, CLK180, and CLK270. The multi-tap adjustable delay line 160 provides a delay equal to the delay provided by the multi-tap adjustable delay line 110. In some embodiments of the invention, the multi-tap adjustable delay line 160 is "matched" to the multi-tap adjustable delay line 110. In such embodiments, the multi-tap adjustable delay line 160 may share the same bias voltage equal to the VBIAS voltage that is used to adjust the multi-tap adjustable delay line 110, as shown in FIG. 1. In some embodiments, the VBIAS voltage is provided to both the multi-tap adjustable delay lines 110, 160 by the bias generator 144. As a result, the multi-tap adjustable delay line 160 provides the same delay to the DCCCLK, DCCCLK/ signals as the multi-tap adjustable delay line 110 provides to the CLKIN, CLKIN/ signals. Due to the locked condition of the delay-locked loop that includes the multi-tap adjustable delay line 110, the multi-tap adjustable delay line 160 will generate CLK0 and CLK360 clock signals that are in-phase, and consequently, the clock signals CLK0, CLK90, CLK180, CLK270 are quadrature clock signals having the appropriate 90-degree phase relationship as the CK0, CK90, CK180, CK270 clock signals. Additionally, the CLK0, CLK90, CLK180, CLK270 have 50-percent duty-cycles resulting from the 50-percent duty-cycles of the DCCCLK, DCCCLK/ signals.

Figure 2:
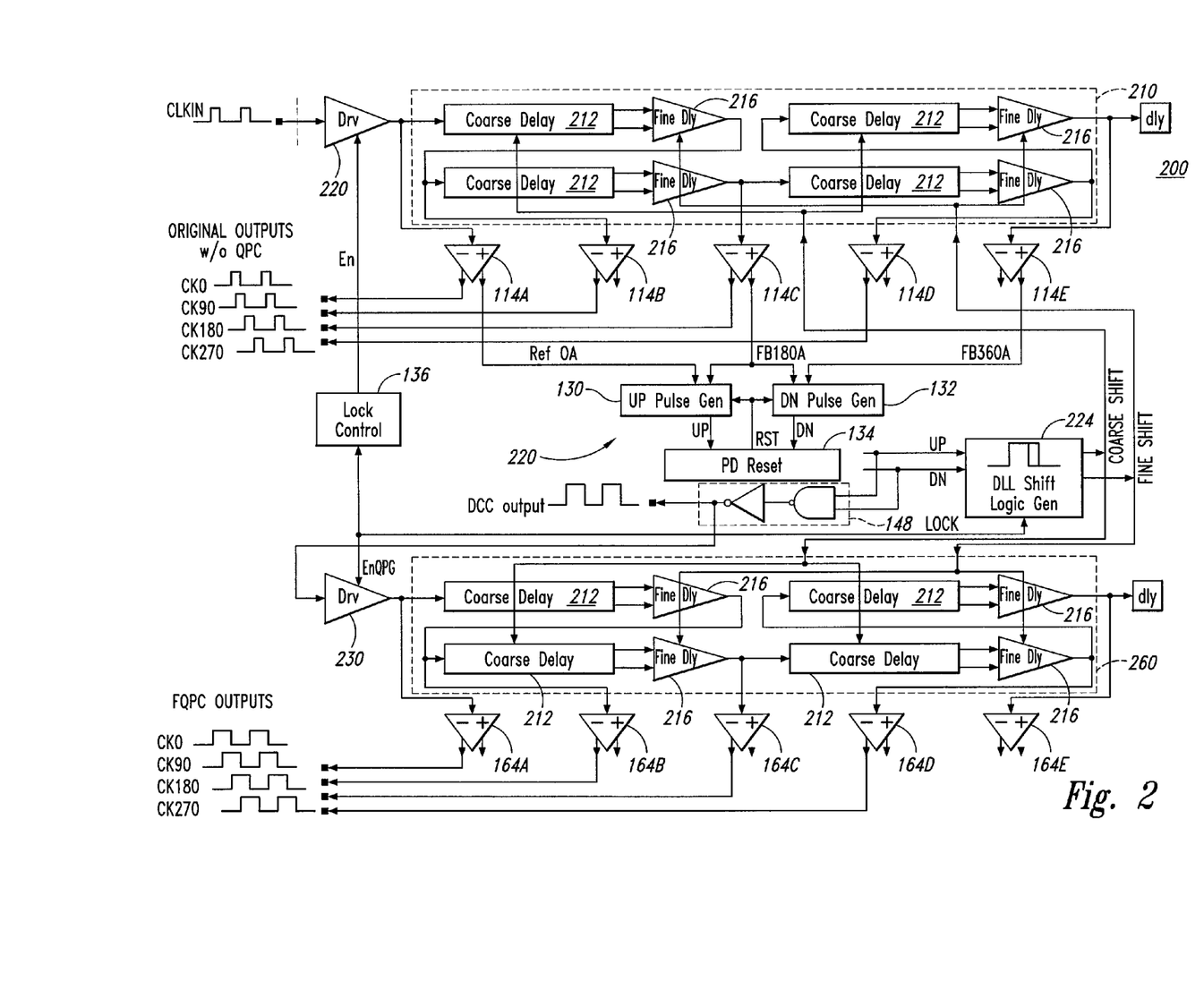
FIG. 2 is a block diagram of a multi-phase duty-cycle corrected clock signal generator according to another embodiment of the invention.

FIG. 2 illustrates a multi-phase duty-cycle corrected clock signal generator 200 according to an embodiment of the invention. The clock signal generator 200 is an example of a digital implementation of a multi-phase duty-cycle corrected clock signal generator. An input clock signal CLKIN is received by a driver 220 and coupled to a digital multi-tap adjustable delay line 210. The delay line 210 includes digital coarse delay elements 212 and digital fine delay elements 216. The output clock signal from the driver 220 and output clock signals from the digital multi-tap adjustable delay line 210 are provided to clock buffers 114A-E, which in turn provide output clock signals CK0, CK90, CK180, CK270. As will be described below, in the embodiment shown in FIG. 2 once the delay-locked loop including the multi-tap adjustable delay line 210 achieves a locked condition, the CK0, CK90, CK180, and CK270 clock signals are quadrature clock signals having 90-degree phase relationships with one another. The CK0, CK90, CK180, and CK270 clock signals, however, are not duty-cycle corrected, and generally have similar duty-cycle distortion as the CLKIN signal.

The clock signal generator 200 further includes a phase detector 220. In embodiments, such as that shown in FIG. 2, the phase detector 220 includes a first pulse generator 130 configured to generate an UP signal in an analogous manner as described above with reference to the embodiment shown in FIG. 1. The phase detector 220 further includes a second pulse generator 132 configured to generate a DN signal in an analogous manner as described above with reference to FIG. 1. The phase detector 220 further includes a reset signal generator 134 configured to generate a reset signal in an analogous manner as described above with reference to FIG. 1. The UP and DN signals are used by shift logic 224 to generate shift control signals to adjust the delay of the delay line 210. For example, in some embodiments of the invention, the shift logic 224 generates coarse and fine delay shift control signals based a difference of the UP and DN signals within one or multiple system clock periods. Additionally or alternatively, shift control signals to shift the delays to increase or decrease the respective delays may be based on a number of counts of difference between the UP and DN signals. The shift logic 224 interacts with the delay-lock control circuit 136 to provide systematic locking operation and detection of locking conditions. The control signals may include a first signal used to adjust delay of the coarse delay elements 212 and a second signal used to adjust delay of the fine delay elements 216, as shown in FIG. 2.

In operation, the phase detector 220 determines phase differences between Ref0A, FB180A, and FB360A clock signals from the adjustable delay line 210 and generates UP and DN pulse signals to adjust the adjustable delay line 210 until the Ref0A and FB360A clock signals are in-phase. Under this condition, the delay-locked loop is considered to be "locked." Once locked, the UP and DN pulse signals are in-phase and both have 50-percent duty-cycles.

The UP and DN pulse signals are provided to output clock logic 148 to generate a DCCOutput clock signal having a 50-percent duty-cycle and generally synchronized with the CLKIN signal with the propagation delay of the first and second pulse generators 130, 132 and the output clock logic 148. The DCCOutput clock signal is provided to a digital multi-tap adjustable delay line 260 through a driver 230. The adjustable delay line 260 includes digital coarse delay elements 212 and digital fine delay elements 216. The output of the driver 230 and output clock signals from the adjustable delay line 260 are provided to clock buffers 164A-E to provide CLK0, CLK90, CLK180, and CLK270 clock signals. The resulting CLK0, CLK90, CLK180, and CLK270 clock signals, which are based on the DCCOutput clock signal having 50-percent duty-cycles, will also have 50-percent duty-cycles as well.

The adjustable delay line 260 is set to provide delays equal to the delays of the adjustable delay line 210. In some embodiments, the adjustable delay line 260 is matched to the adjustable delay line 210. That is, the design of the adjustable delay line 260 is similar to that of the adjustable delay line 210 so that the two adjustable delay lines react the same. The control signals from the shift logic 224 may also be provided to the adjustable delay line 260 so that the delays of the adjustable delay line 260 will be generally the same as that of the adjustable delay line 210, as shown in FIG. 2. As a result, the multi-tap adjustable delay line 260 provides the same delay to the DCCOutput clock signal as the multi-tap adjustable delay line 210 provides to the CLKIN clock signal. Due to the locked condition of the delay-locked loop that includes the multi-tap adjustable delay line 210, the multi-tap adjustable delay line 260 will generate CLK0 and CLK360 clock signals that are in-phase, and consequently, clock signals the CLK0, CLK90, CLK180, CLK270 are quadrature clock signals having the appropriate 90 degree phase relationship.

Although FIG. 2 illustrates an embodiment where the CLKIN and the DCCOutput clock signals are "single-ended" clock signals, in contrast to "differential-ended" clock signals that are complementary to one another, both of which can be utilized in other embodiments.

Figure 3:
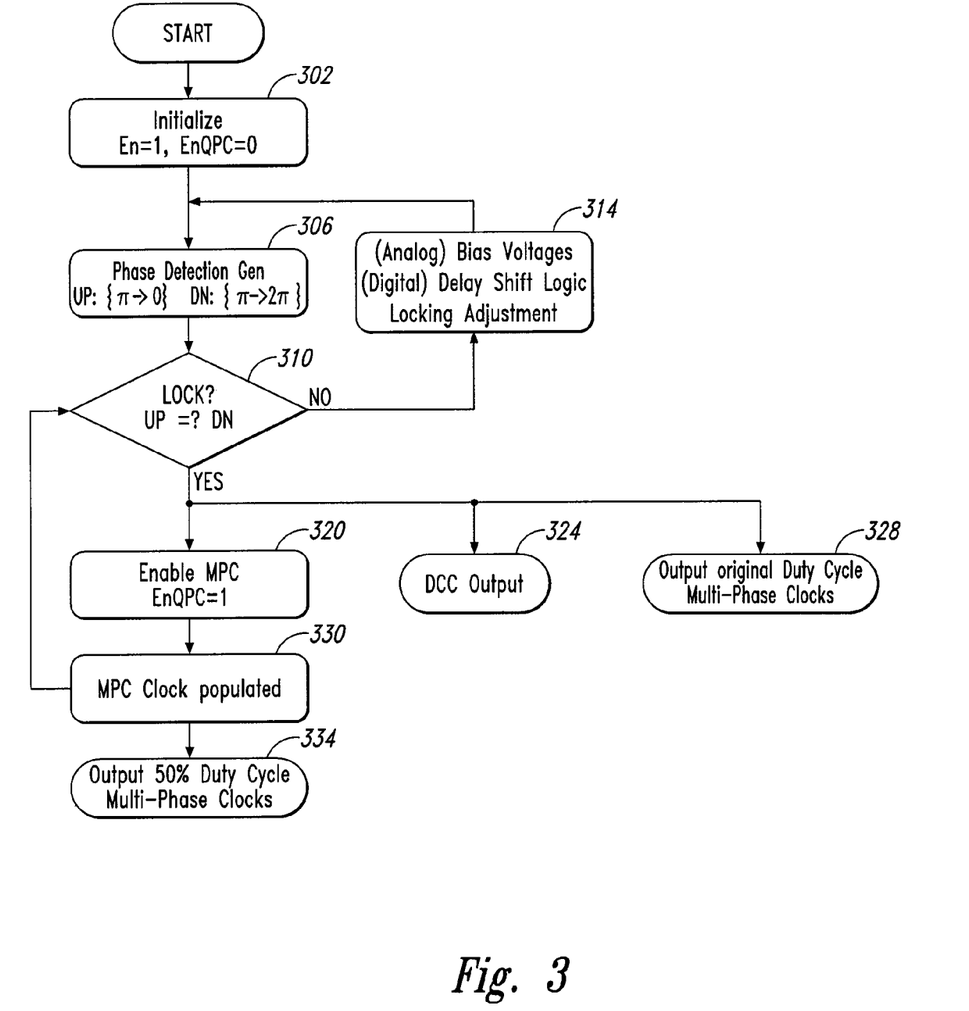
FIG. 3 is a flow diagram for operation according an embodiment of the invention of the multi-phase duty-cycle corrected clock signal generators of FIGS. 1 and 2.

FIG. 3 illustrates operation of the multi-phase duty-cycle corrected clock signal generators 100, 200 according to some embodiments of the invention. The following description will be made with reference to the multi-phase duty-cycle corrected clock signal generator 100, which can also be applied to the multi-phase duty-cycle corrected clock signal generator 200. Differences in operation of the clock signal generators 100, 200 will be described.

The delay-locked loop of the clock signal generator 100 is initialized at 302. For initialization, the delay-lock control circuit 136 generates an active enable signal En that is provided to the reset pulse generator 134 to activate phase detection. The delay-lock control circuit 136 further generates an inactive enable signal EnQPC to hold the complementary clock signal generator 150 inactive. The adjustable delay line 160 can be deactivated as well. As known, upon initially applying power, a delay-locked loop will adjust the delay of the adjustable delay line 110 until a locked timing condition is obtained. In some embodiments of the invention, a two-step initialization procedure is used. In some embodiments, a half-cycle single-step initialization procedure is used. A more detailed description of example two-step and half-cycle single-step initialization procedures are provided in U.S. patent application Ser. No. 12/245,407, previously referenced and incorporated herein by reference.

The process of initializing the delay-locked loop of the clock signal generator 100 continues through steps 306, 310, and 314 until a locked timing condition is obtained. During this time, the phase detector is detecting phase differences between the input clock signals CLKIN, CLKIN/ and an output clock signal of the adjustable delay line 110, for example, the FB360A clock signal, and generates appropriate UP and DN signals to adjust the delay of the adjustable delay line to obtain a locked timing condition. At 314, a VBIAS voltage is generated by the bias generator 144 to adjust the delay of the adjustable delay line 110 of the clock signal generator 100. In digital delay implementations, the shift logic 224 generates control signals to adjust the delay of the adjustable delay line 210 of the clock signal generator 200.

Once the delay-locked loop obtains a locked condition at 310, the multi-phase clock signals output by the adjustable delay line 110 have the desired phase relationship with each other, for example, in some embodiments the adjustable delay line outputs quadrature clock signals CK0, CK90, CK180, CK270. The output clock signals may be provided at 328 to other circuitry for clocking purposes. As previously discussed, however, the multi-phase clock signals output by the adjustable delay line 110 are not duty-cycle corrected, and generally have the same duty-cycle distortion as the CLKIN, CLKIN/ clock signals. A DCCOutput clock signal is also output at 324 by the output clock logic 148 when the delay-locked loop is locked. As previously discussed, the DCCOutput clock signal may be generated from the UP and DN signals, which are in phase, have the same clock period as the CLKIN, CLKIN/ clock signals, and have 50-percent duty-cycles. The resulting DCCOutput clock signal also has the same clock period as the CLKIN, CLKIN/ clock signals and a 50-percent duty-cycle.

The delay-lock control circuit 136 generates an active EnQPC signal at 320 to activate the complementary clock signal generator 150. When activated, the complementary clock signal generator 150 generates the complementary DCCCLK, DCCCLK/ clock signals that are provided to the adjustable delay line 160 at 330. As previously discussed, the adjustable delay line 160 is adjusted to have the same delay as the adjustable delay line 110. As a result, the clock signals output by the adjustable delay line 160 have the same phase relationship as the clock signals output by the adjustable delay line 110. The clock signals output at 334 by the adjustable delay line 160, which in some embodiments are quadrature clock signals CLK0, CLK90, CLK180, CLK270, are duty-cycle corrected and have 50-percent duty-cycles. In embodiments where single ended-clock signals are utilized, such as in the embodiment illustrated in FIG. 2, activation of a complementary clock signal generator may be ignored and the DCCOutput clock signal provided at 324 may be used as the input clock signal to the second multi-tap adjustable delay line.

Figure 4:
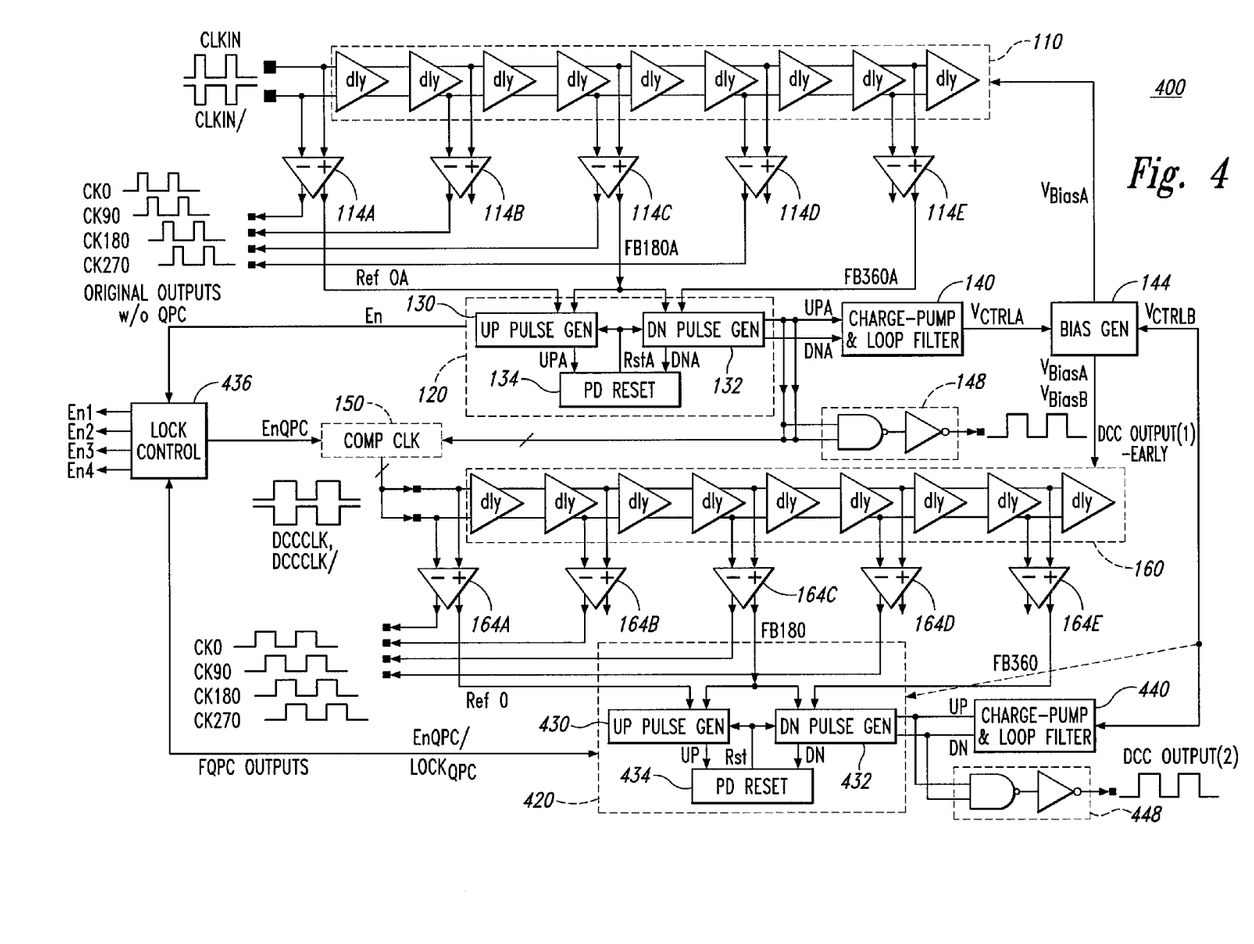
FIG. 4 is a block diagram of a multi-phase duty-cycle corrected clock signal generator according to another embodiment of the invention.

FIG. 4 illustrates a multi-phase duty-cycle corrected clock signal generator 400 according to an embodiment of the invention. The multi-phase duty-cycle corrected clock signal generator 400 is similar to the multi-phase duty-cycle corrected clock signal generator 100 previously described with reference to FIG. 1. The multi-phase duty-cycle corrected clock signal generator 400 additionally includes, however, phase detector 420 and charge-pump and loop filter 440 to provide a second delay-locked loop configuration.

The phase detector 420 generates control pulse signals UP and DN having pulse widths indicative of the phase differences between a REF0A, FB180A, FB360A clock signals output by the multi-tap adjustable delay line 160, which may be independent of and different from delay line 110. In some embodiments, A bias voltage VBIASA generated by bias generator 144 that adjusts the delay of the multi-tap adjustable delay line 110, may be provided to the multi-tap adjustable delay line 160 as an initial bias voltage where there is a difference. The UP and DN signals are provided to the charge-pump and loop filter 440 that generates a control voltage VCTRLB. The VCTRLB voltage is provided to the bias generator 144 which generates a bias voltage VBIASB that is used to adjust the delay time of the adjustable delay line 160. The phase detector 420 continues to modify the pulse widths of the UP and DN signals to adjust the delay of the adjustable delay line 160 until the second delay-locked loop is locked.

In some embodiments, such as that illustrated in FIG. 4, the phase detector 420 includes a first pulse generator 430, a second pulse generator 432, and a reset pulse generator 434 that is coupled to the first and second pulse generators 430, 432. The first pulse generator 130 generates the UP signal and the second pulse generator 132 generates the DN signal 430. The reset pulse generator 434 receives the UP and DN signals and generates a reset pulse to reset the first and second pulse generators 430, 432, as previously described with reference to the phase detector 120 of FIG. 1. Other embodiments utilize any other phase detectors of different configurations and operation that are known in the art.

An output clock logic 448 is further included to generate a duty-cycle corrected clock signal DCCOutput(2), that is based on UP and DN pulse signals generated by the phase detector 420, which may be provided to circuitry other than those to which the DCCOutput (1) clock signal is provided.

In contrast to the multi-phase duty-cycle corrected clock signal generator 100, the multi-phase duty-cycle corrected clock signal generator 400 utilizes two delay-locked loops in generating the multi-phase duty-cycle corrected output clock signals. The configuration of the multi-phase duty-cycle corrected clock signal generator 400 may be advantageous in applications where the first and second delay-locked loops are located in two different locations on a substrate and/or subject to different operating conditions. For example, the two delay-locked loops may be powered by two different power rails and subject to different power supply noise. The locking of the second delay-locked loop reduces susceptibility to the different operating conditions and assists in locking the delay of the adjustable delay line 160 to provide the multi-phase output clock signals having the desired phase relationship.

Figure 5:
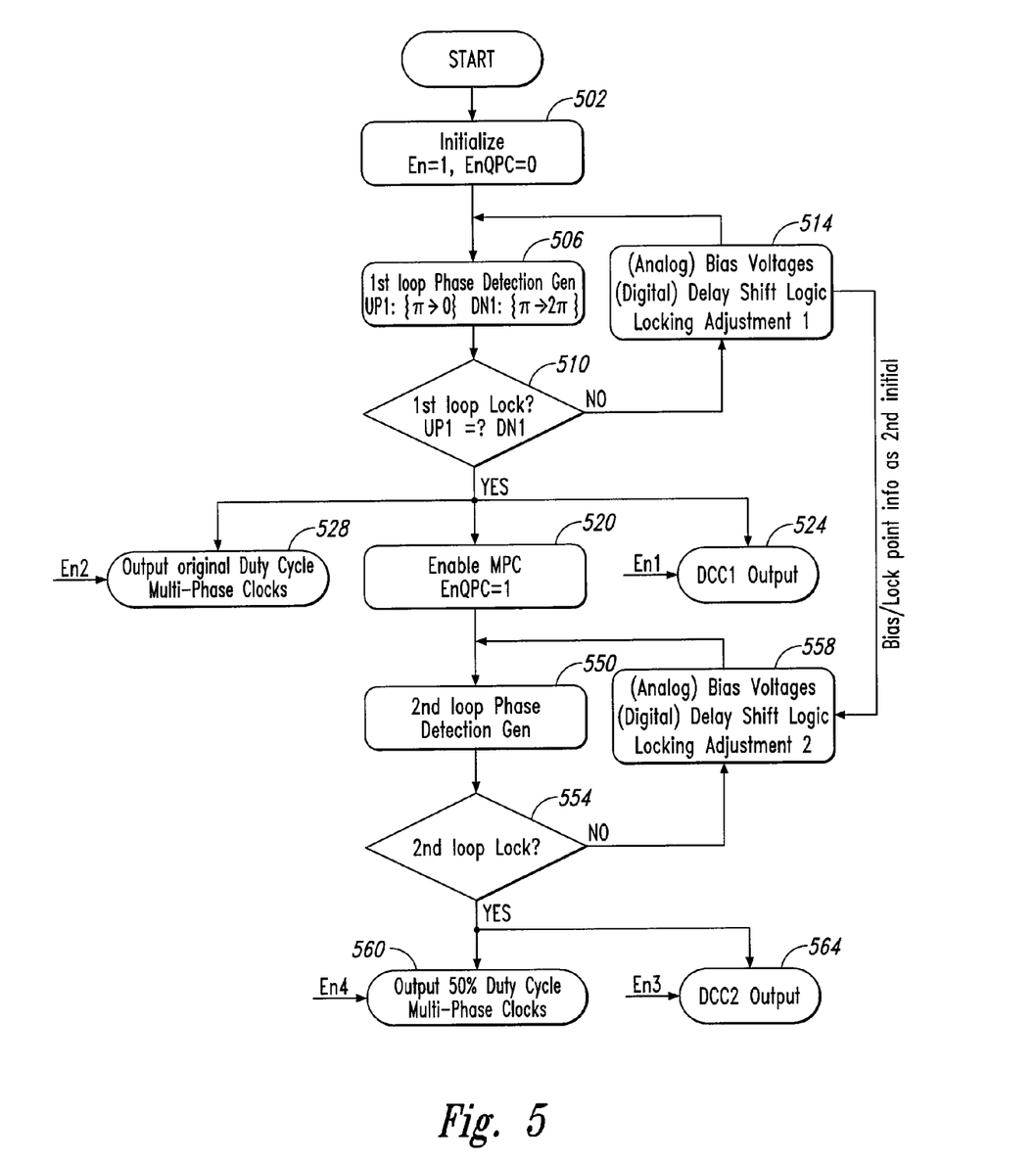
FIG. 5 is a flow diagram for operation according an embodiment of the invention of the multi-phase duty-cycle corrected clock signal generator of FIGS. 4.

FIG. 5 illustrates operation of the multi-phase duty-cycle corrected clock signal generator 400 according to an embodiment of the invention. The first delay-locked loop of the clock signal generator 400 is initialized at 502. For initialization, the delay-lock control circuit 436 generates an active enable signal En that is provided to the reset pulse generator 134 to activate phase detection. The delay-lock control circuit 436 further generates an inactive enable signal EnQPC to hold the complementary clock signal generator 150 inactive. As known, upon initially applying power a delay-locked loop will adjust the delay of the adjustable delay line 110 until a locked timing condition is obtained. In some embodiments of the invention, a two-step initialization procedure is used. In some embodiments, a half-cycle single-step initialization procedure is used. A more detailed description of example two-step and half-cycle single-step initialization procedures are provided in U.S. patent application Ser. No. 12/245,407, previously referenced and incorporated herein by reference.

The process of initializing the first delay-locked loop of the clock signal generator 400 continues through steps 506, 510, and 514 until a locked timing condition is obtained. During this time, the phase detector 120 is detecting phase differences between the input clock signals CLKIN, CLKIN/ and an output clock signal of the adjustable delay line 110, for example, the FB360A clock signal, and generates appropriate UP and DN signals to adjust the delay of the adjustable delay line 110 to obtain a locked timing condition. At 514, a VBIAS voltage is generated by the bias generator 144 to adjust the delay of the adjustable delay line 110 of the clock signal generator 400. Although not specifically shown, in embodiments of the invention having a digital implementation of a multi-phase duty-cycle corrected clock signal generator, a shift logic generator generates control signals to adjust the delay of a digital multi-tap adjustable delay line, for example, as previously described with respect to the multi-phase duty-cycle corrected clock signal generator 200 of FIG. 2.

When the first delay-locked loop obtains a locked condition at 510, the delay-lock control circuit 436 generates an active enable signal En1 to enable output of a DCCOutput(1) clock signal from the output clock logic 148 at 524. As previously discussed, the DCCOutput(1) clock signal may be generated from the UP and DN signals, which are in phase, have the same clock period as the CLKIN, CLKIN/ clock signals, and have 50-percent duty-cycles. The resulting DCCOutput(1) clock signal also has the same clock period as the CLKIN, CLKIN/ clock signals and a 50-percent duty-cycle.

The delay-lock control circuit 436 further generates an active enable signal En2 to output multi-phase clock signals from the adjustable delay line 110 at 528. The multi-phase clock signals output by the adjustable delay line 110 have the desired phase relationship with each other, for example, in some embodiments the adjustable delay line 110 outputs quadrature clock signals CK0, CK90, CK180, CK270. The output clock signals may be provided to circuitry for clocking purposes. As previously discussed, however, the multi-phase clock signals output by the adjustable delay line 110 are not duty-cycle corrected, and generally have the same duty-cycle distortion as the CLKIN, CLKIN/ clock signals.

The delay-lock control circuit 436 generates an active EnQPC signal at 520 to activate the complementary clock signal generator 150. When activated, the complementary clock signal generator 150 generates the complementary DCCCLK, DCCCLK/ clock signals that are provided to the adjustable delay line 160. As previously discussed, in some embodiments of the invention the adjustable delay line 160 is matched to the adjustable delay line 110. In some embodiments, the adjustable delay line 160 is different than the adjustable delay line 110. At this time, the adjustable delay line 160 has initially been adjusted to have the same delay as the adjustable delay line 110. In some embodiments of the invention, the same bias voltage or shift lock control information provided to the adjustable delay lien 110 is also provided to the adjustable delay line 160. With the DCCCLK, DCCCLK/ clock signals being provided to the adjustable delay line 160, the phase detector 420 begins generating UP and DN signals based on the phase difference between the Ref0 And FB360 clock signals. A locked condition is obtained by continuing through steps 550, 554, and 558 to adjust the adjustable delay line 160 until a locked condition is obtained.

When the second delay-locked loop obtains a locked condition at 554, the delay-lock control circuit 436 generates an active enable signal En3 to enable output of a DCCOutput(2) clock signal from the output clock logic 448 at 564. The DCCOutput(2) clock signal is generated from the UP and DN signals from the phase detector 420, which are in phase with one another, have the same clock period as the DCCCLK, DCCCLK/ clock signals, and have 50-percent duty-cycles. As a result, the DCCOutput(2) clock signal also has the same clock period as the DCCCLK, DCCCLK/ clock signals and a 50-percent duty-cycle.

The delay-lock control circuit 436 further generates an active enable signal En4 to output multi-phase clock signals from the adjustable delay line 160 at 560. The multi-phase clock signals output by the adjustable delay line 160 have the desired phase relationship with each other and are duty-cycle corrected, for example, in some embodiments the adjustable delay line 160 outputs duty-cycle corrected quadrature clock signals CLK0, CLK90, CLK180, CLK270.

Although not specifically illustrated, a dual delay-locked loop configuration may be used for digital implementations of multi-phase duty-cycle corrected clock signal generators according to embodiments of the invention. For example, the multi-phase duty-cycle corrected clock signal generator 200 of FIG. 2 can be modified to include a second delay-locked loop, as previously described for the multi-phase duty-cycle corrected clock signal generator 400 of FIG. 4. In some embodiments, the operation of such an implementation is similar to that previously described with reference to FIG. 5. However, some modifications may be made, such as modifying steps 514 and 550 as for the embodiment of FIG. 4.

In embodiments specifically described, the multi-phase duty-cycle corrected clock signal generator provides quadrature clock signals. In some embodiments, a multi-phase duty-cycle corrected clock signal generator additionally or alternatively provides multi-phase signals other than quadrature clock signals. For example, tri-phase clock signals, that is, clock signals having a 120-degree phase relationship with one another, can be tapped from the multi-tap adjustable delay lines of a multi-phase duty-cycle corrected clock signal generator. Multi-phase clock signals having other phase relationships may be additionally or alternatively generated as well.

Figure 6:
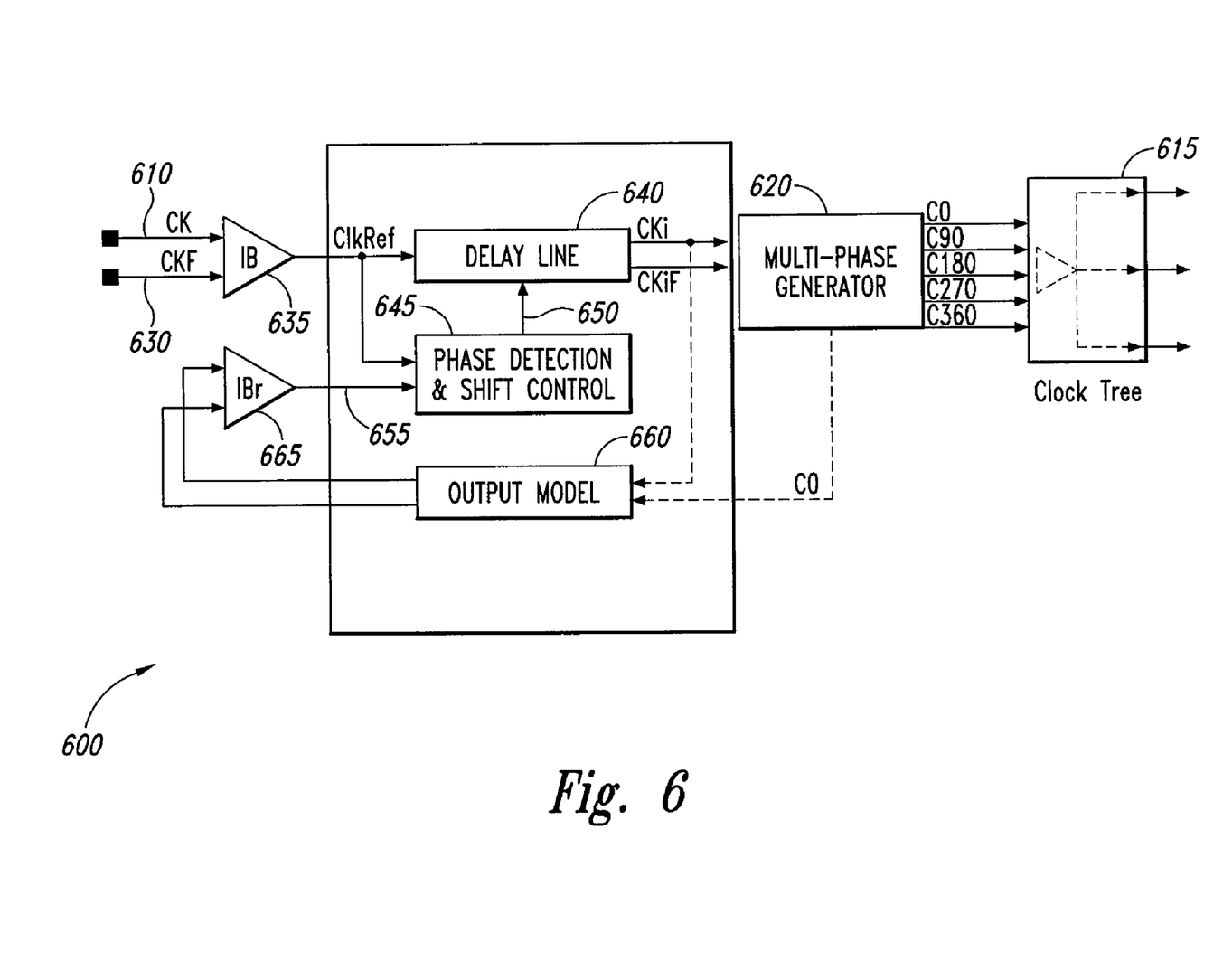
FIG. 6 is a block diagram of a multi-phase duty-cycle corrected clock signal generator according to another embodiment of the invention.

FIG. 6 illustrates a multi-phase duty-cycle corrected clock signal generator 600 according to an embodiment of the invention. A clock signal CK 610 and complementary clock signal CKF 630 are provided to an input buffer 635. A multi-phase duty-cycle corrected clock signal generator 620 according to an embodiment of the invention, including the embodiments previously discussed with reference to FIGS. 1-5, is coupled to a delay locked loop 605. The delay locked loop 605 is used in locking the output signals of the multi-phase duty-cycle corrected clock signal generator 620 to the received clock signal CK 610. The input buffer 635 couples the buffered ClkRef signal to the delay lock loop 605. The delay lock loop 605 includes a delay line 640 and a phase detection and shift control element 645. The delay line 640 is configured and controlled by the phase detection and shift control element 645 to output a clock signal CKi, and optionally a complementary clock signal CKiF. The phase detection and shift control element 645 generates a control signal 650 to adjust the delay of the delay line 640 to minimize a phase difference between the ClkRef signal and a feedback signal 655. The feedback signal 655 may be based on either one of the signals generated by the multi-phase duty-cycle corrected clock signal generator 620 (C0 as shown in FIG. 6), or the input signal CKi to the multi-phase duty-cycle corrected clock signal generator 620, as indicated by the dashed lines in FIG. 6. In this manner, the multi-phase duty-cycle corrected clock signal generator 620 may be either inside of the delay-locked loop 605 (when the signal C0 is used as the feedback signal) or outside of the delay locked loop 605 (when the CKi signal is used).

FIG. 6 also illustrates the output signals of the multi-phase duty-cycle corrected clock signal generator 620 (the signals C0, C90, C180, C270, and C360) coupled to a clock tree 615 for distribution of the clock signals to other circuitry, for example, input and output data buffers. Further, output clock signals of the multi-phase duty-cycle corrected clock signal generator 620 may additionally or instead be coupled to other elements of the multi-phase duty-cycle corrected clock signal generator 600 or other electronic system employing the multi-phase duty-cycle corrected clock signal generator 620.

The feedback signal used by the phase detection and shift control element 645 may be coupled to one or more model delay elements, including the output model element 660 and the buffer delay element 665 shown in FIG. 6. The buffer delay element 665 models the delay of the input buffer 635. The output model delay element 660 models the delay of an output path between the point the feedback signal was generated, and the destination of the signal generated by the multi-phase duty-cycle corrected clock signal generator 620 (for example, the clock tree 615). By delaying the feedback signal by an amount equal to the delay of the output path, the delay locked-loop minimizes the phase difference between the output signal arriving at other the circuitry and the input clock signal 610.

Figure 7:
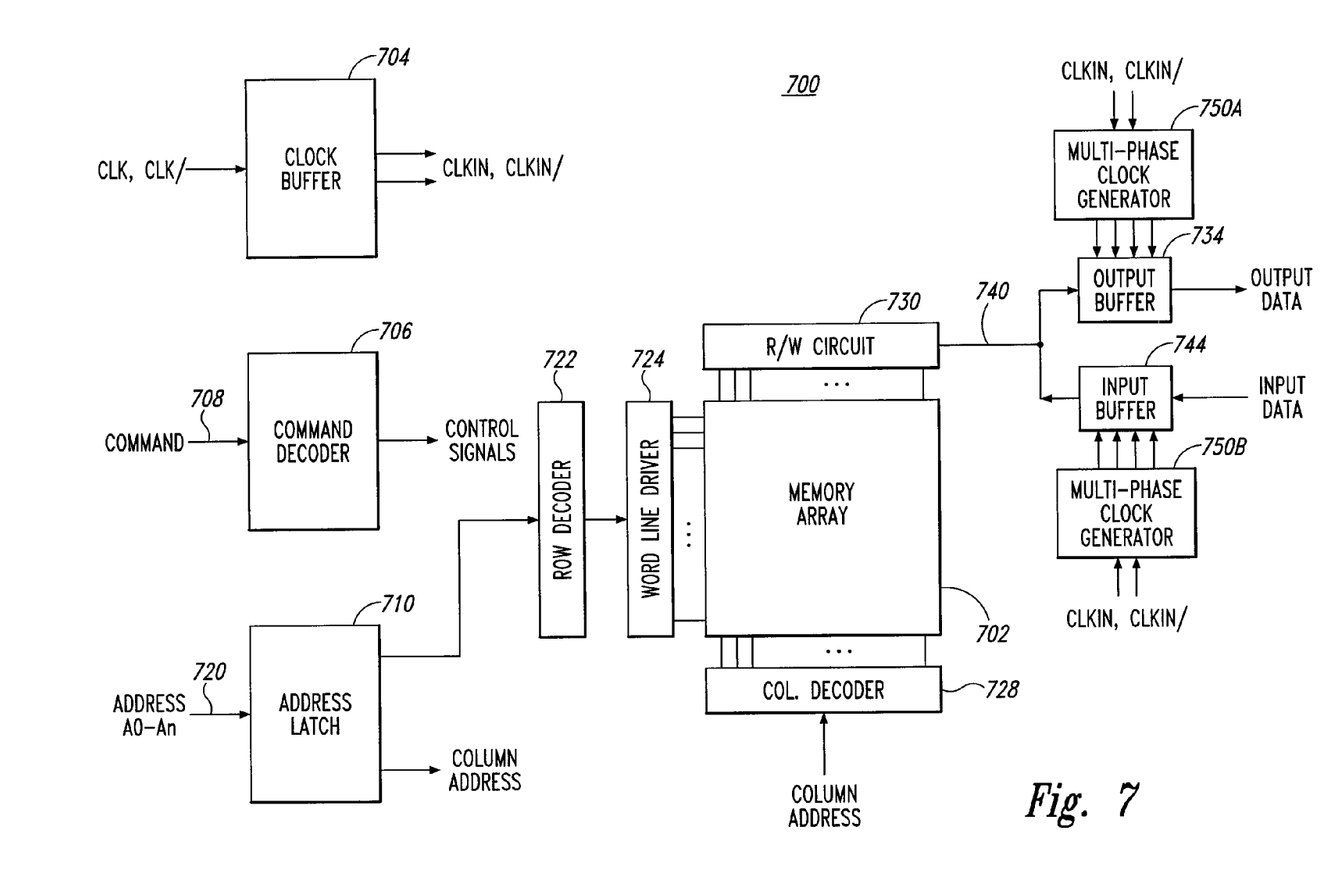
FIG. 7 is a block diagram of a memory having a multi-phase duty-cycle corrected clock signal generator according to an embodiment of the invention.

FIG. 7 illustrates a portion of a memory 700 according to an embodiment of the present invention. The memory 700 includes an array 702 of memory cells, which may be, for example, volatile memory cells, non-volatile memory cells, DRAM memory cells, SRAM memory cells, flash memory cells, or some other types of memory cells. The memory 700 includes a command decoder 706 that receives memory commands through a command bus 708 and generates corresponding control signals within the memory 700 to carry out various memory operations. A clock buffer 704 receives external clock signals CLK, CLK/ and generates internal clock signals CLKIN, CLKIN/ that are used for internal timing of the memory 700. Row and column address signals are applied to the memory 700 through an address bus 720 and provided to an address latch 710. The address latch then outputs a separate column address and a separate row address.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output buffer 734 via an input-output data bus 740. Write data are applied to the memory array 702 through a data input buffer 744 and the memory array read/write circuitry 730. The memory 700 includes a read multi-phase duty-cycle corrected clock generator 750A and a write multi-phase duty-cycle corrected clock generator 750B that provide duty-cycle corrected multi-phase clock signals to the output buffer 734 and the input buffer 744, respectively. The read and write multi-phase duty-cycle corrected clock generators 750A, 750B may be implemented by a multi-phase duty-cycle corrected clock generator according to an embodiment of the invention, for example, the multi-phase duty-cycle corrected clock generator 600 previously described with reference to FIG. 6. The read and write multi-phase duty cycle corrected clock generators 750A, 750B may provide the same or different number of multi-phase clock signals, and provide clock signals having the same or different phase relationships to one another. Moreover, the read and write multi-phase duty cycle corrected clock generators 750A, 750B may provide clock signals having the same or different clock frequencies. Although not shown, in some embodiments of the invention clock signals generated by the read multi-phase duty-cycle corrected clock generators 750A may also be provided to the read/write circuitry 730 and in some embodiments clock signals generated by the write multi-phase duty-cycle corrected clock generators 750B may also be provided to the command decoder 706, address latch 710, and the read/write circuitry 730. The multi-phase duty cycle corrected clock generators 750 receive the CLKIN, CLKIN/ signals and generate multi-phase clock signals having 50-percent duty cycles. The multi-phase duty-cycle corrected clock signals are provided to the output and input buffers 734, 744 to clock the respective buffers to output and input data. Duty-cycle corrected multi-phase clock generators according to embodiments of the invention may be included in the memory 700 for other applications as well. The command decoder 706 responds to memory commands applied to the command bus 708 to perform various operations on the memory array 702. In particular, the command decoder 706 is used to generate internal control signals to read data from and write data to the memory array 702.

From the foregoing it will be appreciated that, although specific embodiments of the invention have been described herein for purposes of illustration, various modifications may be made without deviating from the spirit and scope of the invention. For example, the previous description discussed application of various embodiments of the invention in memory. However, embodiments of the invention may also be used in other electronic systems as well, including central processing units, graphics processing units, and other electronic systems in which multi-phase clock signals are utilized. Accordingly, the invention is not limited except as by the appended claims.

What is claimed is:

1. A multi-phase clock signal generator, comprising:
   a delay-locked loop having a first multi-tap adjustable delay line configured to delay a reference signal to provide a plurality of clock signals having different phases relative to the reference clock signal; and
   a second multi-tap adjustable delay line coupled to the delay-locked loop to receive a delay control signal and a periodic signal having a 50-percent duty cycle and the same period as the reference clock signal, the second multi-tap adjustable delay line configured to delay the periodic signal according to the delay control signal from the delay-locked loop to provide a plurality of clock signals having different phases relative to the periodic signal.

2. The multi-phase clock signal generator of claim 1 wherein the periodic signal comprises at least one signal indicative of a phase difference between the reference clock signal and one of the plurality of clock signals from the first multi-tap adjustable delay line.

3. The multi-phase clock signal generator of claim 1 wherein the delay-locked loop comprises a phase detector including:
   a first pulse generator coupled to receive the reference clock signal and a first delayed clock signal from the first multi-tap adjustable delay line, the first pulse generator configured to generate a first control pulse having a pulse length indicative of the phase difference between the reference clock signal and the first delayed clock signal;

a second pulse generator coupled to receive the first delay clock signal and a second delayed clock signal from the first multi-tap adjustable delay line, the second pulse generator configured to generate a second control pulse having a pulse length indicative of the phase difference between the first and second delayed clock signals; and a reset pulse generator coupled to the first and second pulse generators and configured to generate a reset pulse terminating at least one of the first or the second pulse, or a combination thereof.

4. The multi-phase clock signal generator of claim 1, further comprising:

a phase detector coupled to the second multi-tap adjustable delay line and configured to generate a phase difference signal indicative of a phase difference between the periodic signal and one of the plurality of clock signals from the second multi-tap adjustable delay line; and a delay control circuit coupled to the phase detector and the second multi-tap adjustable delay line, the delay control circuit configured to generate a delay adjustment signal according to the phase difference signal to adjust the delay of the second multi-tap adjustable delay line.

5. The multi-phase clock signal generator of claim 1 wherein the first and second multi-tap adjustable delay lines comprise an adjustable delay line configured to adjust a delay according to a voltage control signal.

6. The multi-phase clock signal generator of claim 1 wherein the first and second multi-tap adjustable delay lines comprise an adjustable delay line configured to adjust a delay according to a shift control signal.

7. The multi-phase clock signal generator of claim 1 wherein the second multi-tap adjustable delay lines is configured to delay the periodic signal to provide a plurality of quadrature clock signals.

8. The multi-phase clock signal generator of claim 1 wherein the second multi-tap adjustable delay line is configured to delay the periodic signal to provide a plurality of tri-phase clock signals.

9. A multi-phase clock signal generator, comprising:

a first multi-tap adjustable delay line configured to generate a plurality of delayed clock signals in response to a reference clock signal;

a phase detector coupled to receive the reference clock signal and one of the plurality of delayed clock signals from the first multi-tap adjustable delay line, the phase detector configured to generate phase difference signals indicative of a phase difference between the reference clock signal and the one delayed clock signal, the phase detector further configured to generate difference signals having a 50-percent duty cycle in response to the reference clock signal and the one delayed clock signal being in-phase;

a delay line controller coupled to the phase detector to receive the phase difference signals, the delay line controller configured to generate a delay line control signal to adjust a delay of the first multi-tap adjustable delay line in response to the phase difference signals;

a second multi-tap adjustable delay line coupled to the phase detector and the delay line controller, the second multi-tap adjustable delay line configured have a delay according to the delay line control signal and generate a plurality of delayed clock signals in response to the phase difference signals.

10. The multi-phase clock signal generator of claim 9 wherein the first multi-tap adjustable delay line comprises a multi-tap adjustable delay line having analog delay stages.

11. The multi-phase clock signal generator of claim 9 wherein the first multi-tap adjustable delay line comprises a multi-tap adjustable delay line having digital delay stages.

12. The multi-phase clock signal generator of claim 11 wherein the digital delay stages comprise at least coarse delay elements, fine delay elements, or both.

13. The multi-phase clock signal generator of claim 9 wherein the second multi-tap adjustable delay line comprises a multi-tap adjustable delay line matched to the first multi-tap adjustable delay line.

14. The multi-phase clock signal generator of claim 9 wherein the phase detector comprises:

a first pulse generator coupled to receive the reference clock signal and a first delayed clock signal from the first multi-tap adjustable delay line, the first pulse generator configured to generate a first control pulse having a pulse length indicative of the phase difference between the reference clock signal and the first delayed clock signal;

a second pulse generator coupled to receive the first delay clock signal and a second delayed clock signal from the first multi-tap adjustable delay line, the second pulse generator configured to generate a second control pulse having a pulse length indicative of the phase difference between the first and second delayed clock signals; and a reset pulse generator coupled to the first and second pulse generators and configured to generate a reset pulse terminating at least one of the first or second pulses, or a combination thereof.

15. The multi-phase clock signal generator of claim 9, further comprising output clock logic circuit coupled to the phase detector and configured to generate an output clock signal based on the phase difference signals.

16. The multi-phase clock signal generator of claim 15 wherein the output clock logic is further coupled to the second multi-tap adjustable delay line and configured to provide the output clock signal to the same.

17. The multi-phase clock signal generator of claim 9, further comprising a complementary clock signal generator coupled to the phase detector and the second multi-tap adjustable delay line, the complementary clock signal generator configured to generate complementary clock signals from the phase difference signals.

18. The multi-phase clock signal generator of claim 9, further comprising a delay-lock control circuit configured to generate enable signals to enable provision of the phase difference signals to the second multi-tap adjustable delay line in response to the reference clock signal and the one delayed clock signal being in-phase.

19. The multi-phase clock signal generator of claim 9 wherein the delay line controller comprises a charge-pump and loop filter circuit and a bias generator.

20. The multi-phase clock signal generator of claim 9 wherein the delay line controller comprises shift logic configured to generate the delay line control signal.

21. A memory comprising:

an array of memory cells;

a command decoder configured to decode received command signals and to generate control signals corresponding to the command signals;

a clock buffer configured to receive external clock signals and provide a reference clock signal in response;

a data path coupled to the array of memory cells, the data path configured to couple read data from the array of memory cells and to couple write data to the array of memory cells;

an input data buffer coupled to the data path and configured to latch input data in response to input data buffer clock signals;

an output data buffer coupled to the data path and configured to output data in response to output data buffer clock signals; and a multi-phase clock signal generator coupled to the clock buffer and further coupled to the input and output data buffers, the multi-phase clock signal generator comprising:

a delay-locked loop having a first multi-tap adjustable delay line configured to delay the reference signal from the clock buffer to provide a plurality of clock signals having different phases relative to the reference clock signal; and a second multi-tap adjustable delay line coupled to the delay-locked loop to receive a delay control signal and a periodic signal having a 50-percent duty cycle and the same period as the reference clock signal, the second multi-tap adjustable delay line configured to delay the periodic signal according to the delay control signal from the delay-locked loop to provide a plurality of clock signals having different phases relative to the periodic signal, at least one of the plurality of clock signals provided by the first and second multi-tap adjustable delays provided to at least one of the input and output data buffers.

22. The memory of claim 21 wherein the periodic signal comprises at least one signal indicative of a phase difference between the reference clock signal and one of the plurality of clock signals from the first multi-tap adjustable delay line.

23. The memory of claim 21 wherein the multi-phase clock signal generator further comprises:

a phase detector coupled to the second multi-tap adjustable delay line and configured to generate a phase difference signal indicative of a phase difference between the periodic signal and one of the plurality of clock signals from the second multi-tap adjustable delay line; and a delay control circuit coupled to the phase detector and the second multi-tap adjustable delay line, the delay control circuit configured to generate a delay adjustment signal according to the phase difference signal to adjust the delay of the second multi-tap adjustable delay line.

24. The memory of claim 21 wherein the first and second multi-tap adjustable delay lines of the multi-phase clock signal generator comprise an analog adjustable delay line.

25. The memory of claim 21 wherein the first and second multi-tap adjustable delay lines of the multi-phase clock signal generator comprise a digital adjustable delay line.

26. The memory of claim 21 wherein the delay-locked loop of the multi-phase clock signal generator comprises a first delay-locked loop, and the memory further comprises:

a second delay-locked loop coupled to the clock buffer and further coupled to the multi-phase clock signal generator, the second-delay locked loop configured to generate an internal clock signal in response to receiving the reference clock signal from the clock buffer; and a clock tree circuit coupled to the multi-phase clock signal generator and configured to receive clock signals therefrom and generate a plurality of internal clock signals.

27. A method for generating multi-phase duty cycle corrected clock signals, comprising:

locking a delay-locked loop having a first multi-tap adjustable delay line;

providing a periodic signal generated by the delay-locked loop to a second multi-tap adjustable delay line as an input clock signal;

adjusting the second multi-tap adjustable delay line to have a same delay as the first multi-tap adjustable delay line; and providing clock signals from taps of the second multi-tap adjustable delay line as the multi-phase duty cycle corrected clock signals.

28. The method of claim 27, further comprising locking a delay-locked loop including the second multi-tap adjustable delay line.

29. The method of claim 27 wherein providing a periodic signal generated by the delay-locked loop comprises providing phase difference signals indicative of a phase difference between a reference clock signal and a delayed clock signal from the first multi-tap adjustable delay line.

30. The method of claim 27 wherein providing clock signals from taps of the second multi-tap adjustable delay line comprises providing quadrature clock signals from the taps of the second multi-tap adjustable delay line.

31. The method of claim 27, further providing a plurality of clock signals generated by the first multi-tap adjustable delay line.

32. The method of claim 27, further comprising logically combining the phase difference signals to provide a duty-cycle corrected clock signal.

33. The method of claim 27 wherein adjusting the second multi-tap adjustable delay line to have a same delay as the first multi-tap adjustable delay line comprises providing a voltage control signal to the second multi-tap adjustable delay line.

34. The method of claim 27 wherein adjusting the second multi-tap adjustable delay line to have a same delay as the first multi-tap adjustable delay line comprises providing a shift control signal to the second multi-tap adjustable delay line.

* * * * *